(12) United States Patent
Keshavarzi et al.

(10) Patent No.: US 7,501,316 B2
(45) Date of Patent: Mar. 10, 2009

(54) ASYMMETRIC MEMORY CELL

(75) Inventors: Ali Keshavarzi, Portland, OR (US); Stephen H. Tang, Beaverton, OR (US); Dinesh Somasekhar, Portland, OR (US); Fabrice Paillet, Hillsboro, OR (US); Muhammad M. Khellah, Lake Oswego, OR (US); Yibin Ye, Portland, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 11/268,098

(22) Filed: Nov. 7, 2005

(65) Prior Publication Data

US 2006/0054933 A1 Mar. 16, 2006

Related U.S. Application Data

(62) Division of application No. 10/750,572, filed on Dec. 31, 2003, now Pat. No. 6,992,339.

(51) Int. Cl.
*H01L 21/82* (2006.01)
(52) U.S. Cl. .................. 438/128; 438/238; 257/202; 257/316; 365/149
(58) Field of Classification Search .......... 257/202, 257/335, 296, 298, 285, 286, 316; 365/149; 438/128, 587, 598, 238–239, 386, 399
See application file for complete search history.

(56) References Cited

U.S. PATENT DOCUMENTS

| 4,441,246 | A | * | 4/1984 | Redwine | 438/239 |
| 5,294,819 | A | | 3/1994 | Simko | |
| 5,448,513 | A | | 9/1995 | Hu et al. | |
| 5,753,958 | A | | 5/1998 | Burr et al. | |
| 6,548,842 | B1 | * | 4/2003 | Bulucea et al. | 257/288 |
| 6,566,176 | B1 | | 5/2003 | Chan | |
| 6,583,001 | B1 | | 6/2003 | Burr | |

(Continued)

OTHER PUBLICATIONS

Ohsawa, Takashi et al., Memory Design Using a One-Transistor Gain Cell on SOI, IEEE Journal of Solid-State Circuits, vol. 37, No. 11, Nov. 2002, ISSN: 0018-9200, pp. 1510-1522.

(Continued)

*Primary Examiner*—Thinh T Nguyen
(74) *Attorney, Agent, or Firm*—Buckley, Maschoff & Talwalkar LLC

(57) ABSTRACT

Some embodiments provide a memory cell that includes a body region, a source region and a drain region. The body region is doped with charge carriers of a first type, the source region is disposed in the body region and doped with charge carriers of a second type, and the drain region is disposed in the body region and doped with charge carriers of the second type. The body region and the source region form a first junction, the body region and the drain region form a second junction, and a conductivity of the first junction from the body region to the source region in a case that the first junction is unbiased is substantially less than a conductivity of the second junction from the body region to the drain region in a case that the second junction is unbiased.

4 Claims, 9 Drawing Sheets

U.S. PATENT DOCUMENTS 6,661,042 B2 * 12/2003 Hsu .......................... 257/239
6,778,424 B2   8/2004 Iwata et al.
6,861,689 B2 *  3/2005 Burnett ....................... 257/296

OTHER PUBLICATIONS

Thompson, Scott, et al., "MOS Scaling: Transistor Challengers for the 21st Century", Intel Technology Journal Q3 '98. 19pgs.

Ohsawa, Takashi et al., "ISSCC 2002 / Session 9 / Dram and Ferroelectric Memories / 9.1", Memory LSI Research and Development Center, Yokohama, Japan. 3pgs.

Brand, A. et al., "Intel's 0.25 Micron, 2.0Volts Logic Process Technology", Intel Technology Journal Q3 '98. 9pgs.

* cited by examiner

ASYMMETRIC MEMORY CELL

CROSS-REFERENCE TO RELATED APPLICATION

This is a divisional of prior U.S. patent application Ser. No. 10/750,572, filed Dec. 31, 2003, now U.S. Pat. No. 6,992,339.

BACKGROUND

Conventional electronic memories may be implemented by arrays of discrete memory cells. Many types of memory cells and many systems for writing a value to and reading a value from a memory cell currently exist.

FIG. 1 shows a cross-sectional view of floating-body dynamic random access memory (FBDRAM) memory cell 1. Cell 1 comprises a single transistor and is known as a gain cell because a value may be stored within and read from the transistor. The transistor is fabricated upon oxide 2 in a silicon-on-insulator (SOI) arrangement. The transistor includes n-type source region 3, p-type body region 4 and n-type drain region 5. Oxide 6 is disposed over gate region 4 and conductive element 7 overlays oxide 6.

A value is stored and read by manipulating charge carriers within body region 4. To improve charge retention, body region 4 may be isolated from adjacent memory cells by oxide 6, by the pn junctions between itself, source region 3 and drain region 5, and by shallow trench isolation in front of and behind the plane of FIG. 1. SOI process technology may, however, be undesirable in some instances.

DETAILED DESCRIPTION

Figure 1:
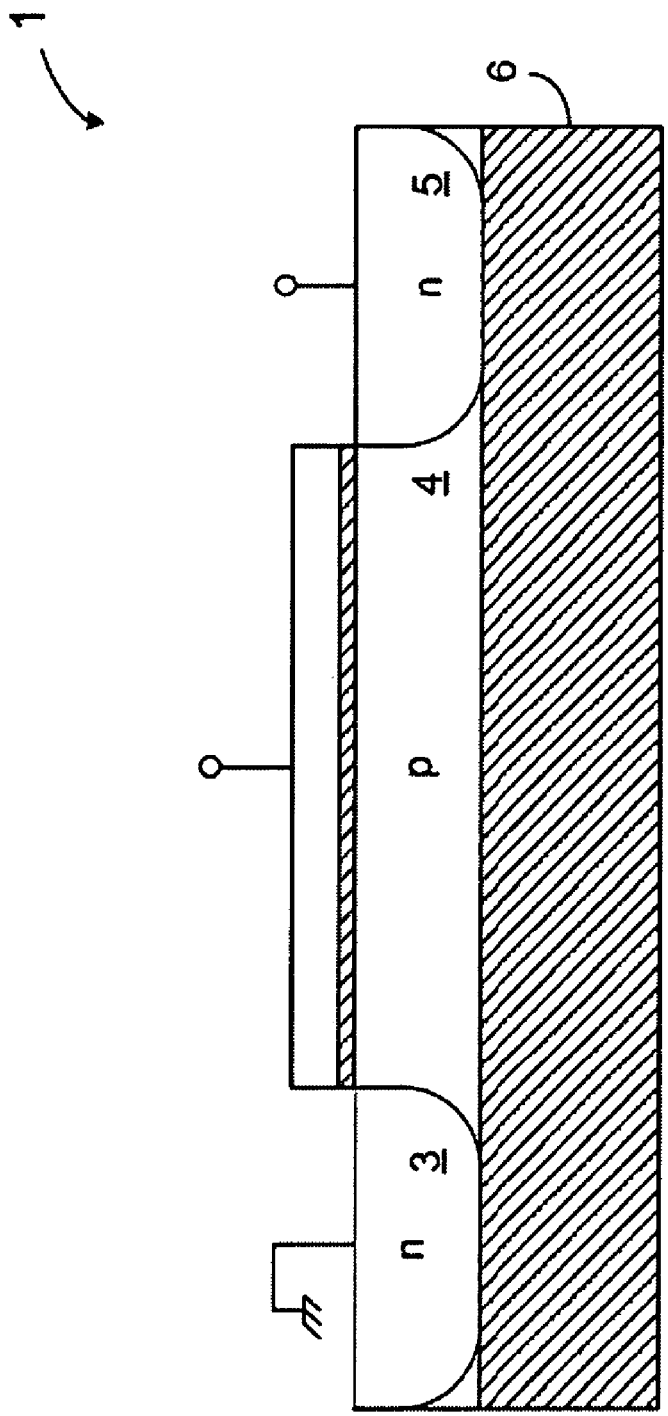
FIG. 1 is a cross-sectional view of an FBDRAM memory cell.
Figure 2:
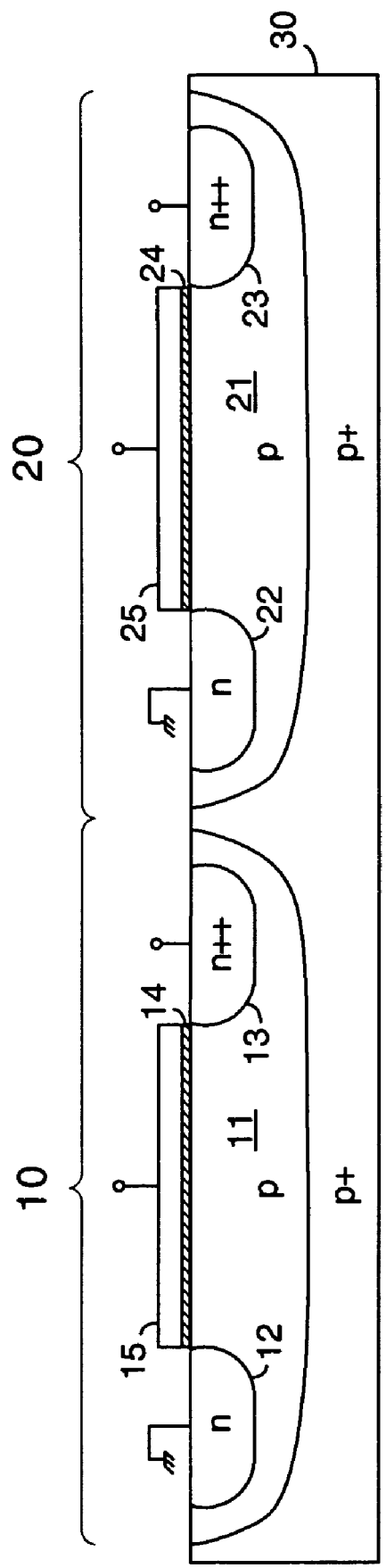
FIG. 2 is a cross-sectional view of memory cells according to some embodiments.

FIG. 2 is a cross-sectional side view of two memory cells according to some embodiments. Memory cells 10 and 20 are disposed adjacent to one another within substrate 30. Substrate 30 may comprise any currently- or hereafter-known semiconductor substrate, including but not limited to silicon. As indicated by FIG. 2, substrate 30 is doped so as to include an excess of p-type charge carriers, or holes. Doping methods and materials used for each doped structure described herein may comply with any currently- or hereafter-known suitable methods and materials.

Memory cell 10 includes body region 11, which is doped with an excess of p-type charge carriers. The concentration of charge carriers in body region 11 is less than the concentration of charge carriers in substrate 30, as indicated by their respective "p" and "p+" designations.

Source region 12 is disposed within body region 11, and is doped with an excess of n-type charge carriers. Drain region 13 is also disposed within body region 11 and is doped with an excess of n-type charge carriers. The concentration of charge carriers in source region 12 is less than the concentration of charge carriers in drain region 13, as indicated by their respective "n" and "n++" designations.

Body region 11 and source region 12 form a first pn junction at their interface. Similarly, body region 11 and drain region 13 form a second pn junction at their interface. In a case that both the first junction and the second junction are unbiased, a conductivity of the first junction from body region 11 to source region 12 is substantially less than a conductivity of the second junction from body region 11 to drain region 13. Such an arrangement may reduce leakage from body region 11 to source region 12, thus improving charge retention (i.e. the storage of a value) within body region 11. Such an arrangement may also facilitate the manipulation of charge (i.e., programmability of a value) within body region 11.

Gate oxide 14 is disposed over body region 11 and conductive material 15 is disposed thereon. Gate oxide 14 may comprise any suitable insulator, including but not limited to $SiO_2$, and conductive material 15 may comprise any conductor, including but not limited to polysilicon. Various layers of metallization and/or dielectric may be disposed above memory cell 10 according to some embodiments.

Memory cell 20 includes body region 21, source region 22, drain region 23, gate oxide 24, and conductive material 25, each of which may be substantially similar to their identically-named counterparts of memory cell 10. In some embodiments, body region 11 is separated from body region 21 by a shallow trench (not shown).

Figure 3A:
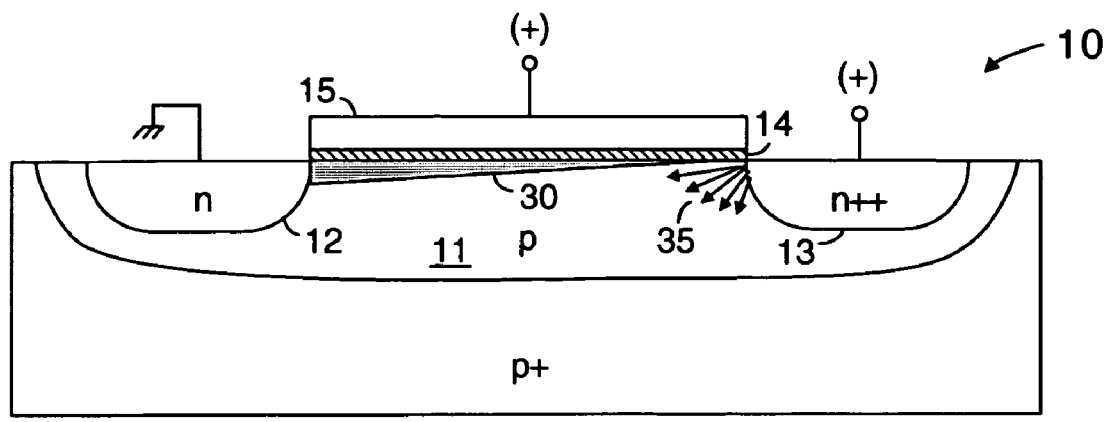
FIG. 3A is a cross-sectional view of a memory cell illustrating a write operation according to some embodiments.
Figure 3B:
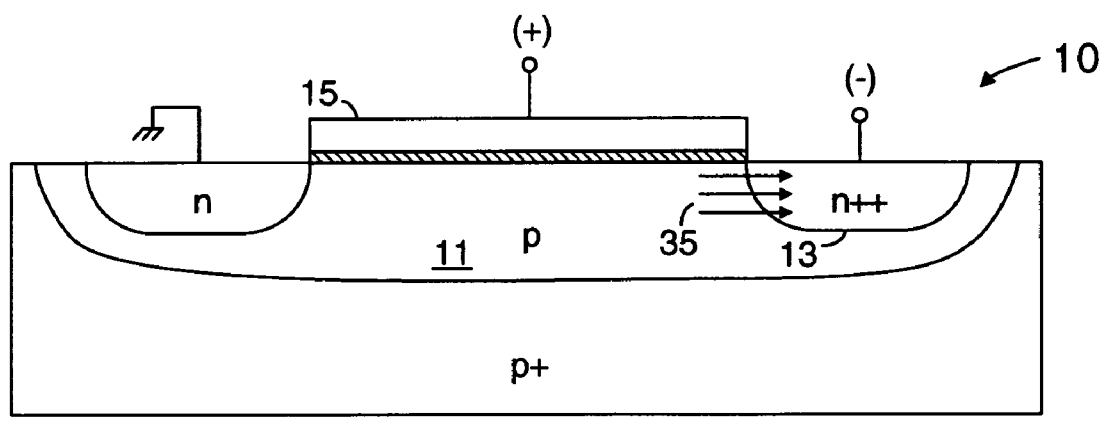
FIG. 3B is a cross-sectional view of a memory cell illustrating a write operation according to some embodiments.
Figure 3C:
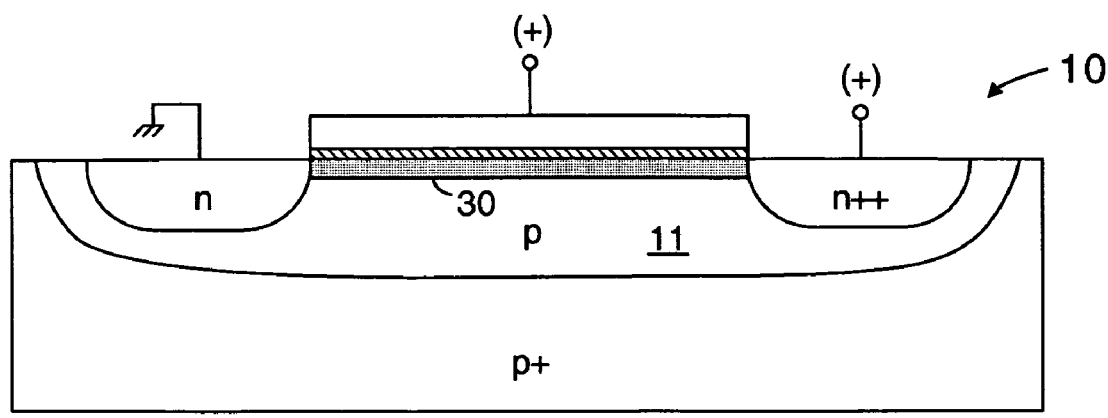
FIG. 3C is a cross-sectional view of a memory cell illustrating a read operation according to some embodiments.

FIGS. 3A through 3C illustrate the operation of memory cell 10 according to some embodiments. FIG. 3A illustrates an operation to write a value to memory cell 10. According to the operation, memory cell 10 is operated in saturation to inject p-type charge carriers into body region 11 via impact ionization. In some embodiments, source region 12 is coupled to ground, conductive material 15 is coupled to a positive voltage, and drain region 13 is coupled to a positive voltage so as to cause memory cell 10 to operate in saturation.

FIG. 3A illustrates channel 30 that develops beneath gate oxide 14 during such operation. Charge carriers 35 are injected to body region 11 because channel 30 is "pinched off" at drain region 13. The injected charge carriers may represent a stored value of "1", but other stored values may be represented by the carriers depending on the chosen convention.

FIG. 3B illustrates an operation to write a value to memory cell 10 according to some embodiments. In this operation, a pn junction formed by body region 11 and drain region 13 is forward-biased to eject charge carriers 35 from body region 11. The junction may be forward-biased by applying a positive voltage to conductive material 15 and a negative voltage to drain region 13 since body region 11 is a p-type region and drain region 13 is an n-type region. After the operation, body region 11 may be considered to store a value of "0", but again, other conventions may be used.

FIG. 3C illustrates reading a value from memory cell 10 according to some embodiments. Channel 30 is shown to indicate that memory cell 10 is operating in a substantially linear operational region. Accordingly, memory cell 10 develops a drain current that is based at least in part on a concentration of charge carriers within body region 11. The concentration of charge carriers may therefore be determined based on the drain current. In some embodiments, the drain current is higher for a higher concentration of charge carriers (e.g., representing a stored "1" value), and lower for a lower concentration of charge carriers (e.g., representing a stored "0" value).

Figure 4:
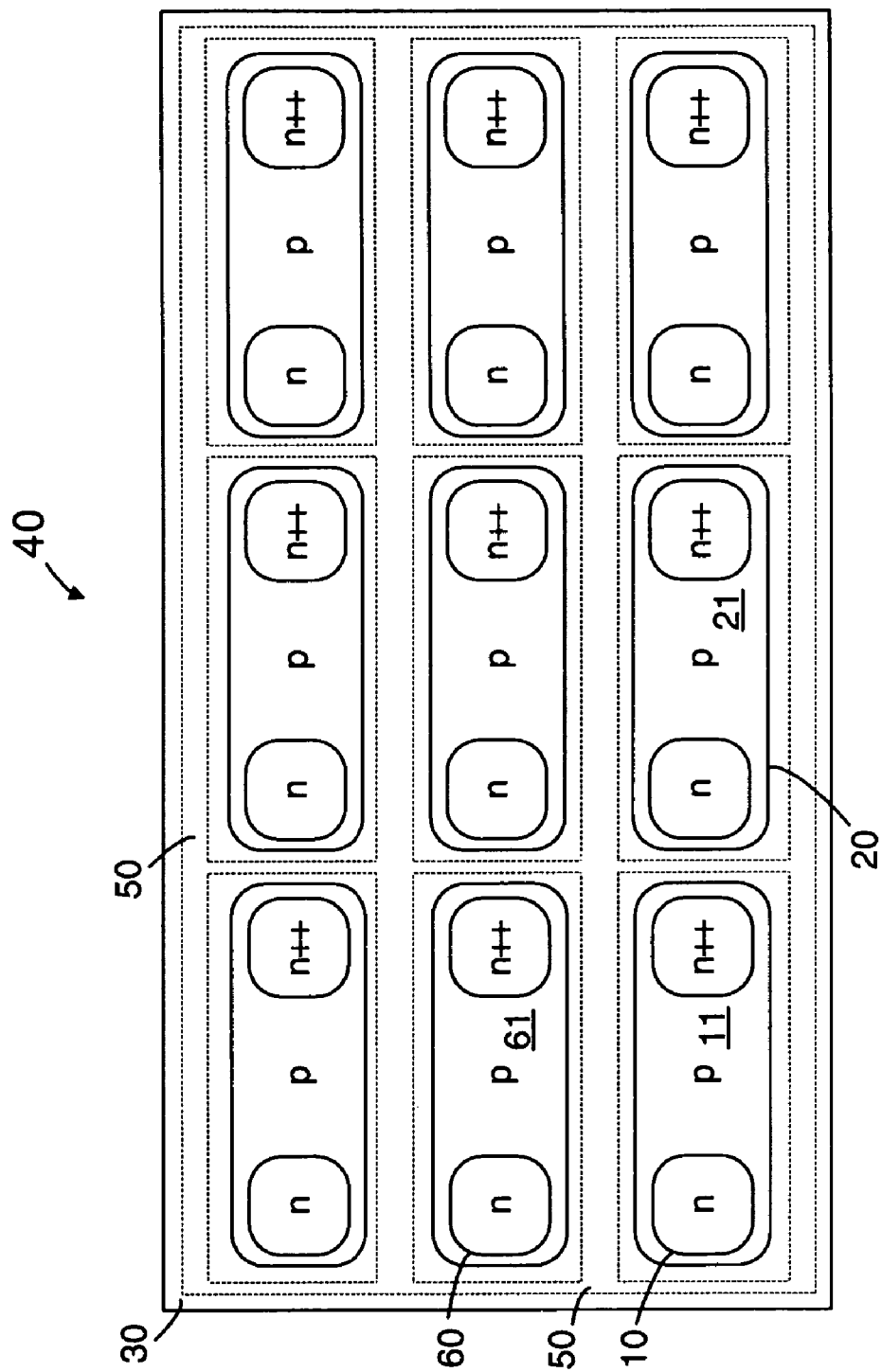
FIG. 4 is a top view of a memory cell array according to some embodiments.

FIG. 4 is a top view of memory cell array 40 according to some embodiments. Memory cell array 40 includes memory cells 10 and 20 disposed in substrate 30. Body region 11 of cell 10 is separated from body region 21 of cell 20 by shallow trench 50. Trench 50 separates each illustrated memory cell from each other memory cell. For example, trench 50 separates body region 11 from body region 61 of memory cell 60. Such separation may improve charge retention within the respective body regions.

Figure 5:
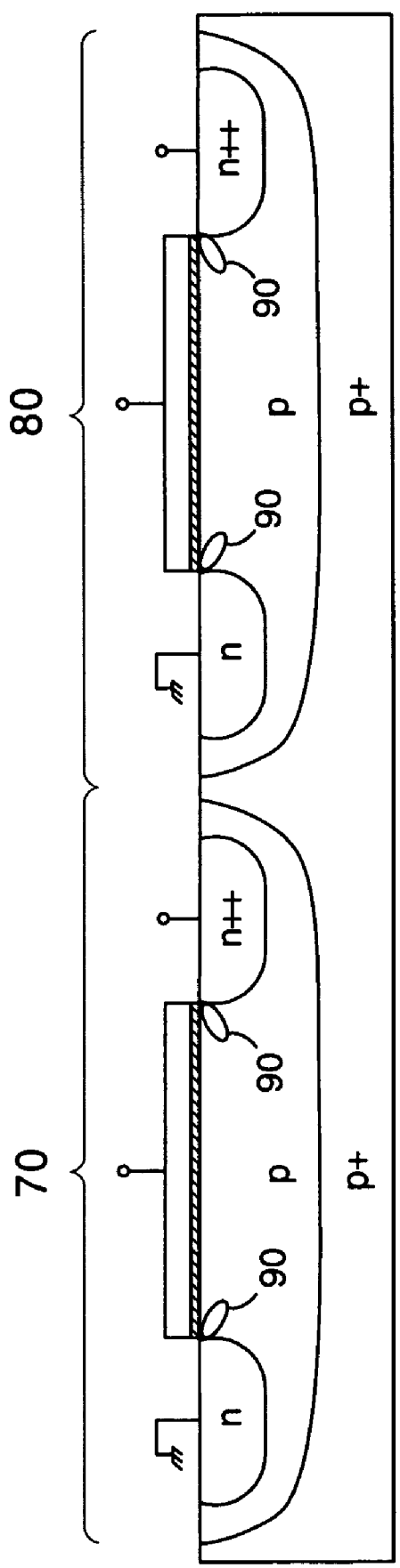
FIG. 5 is a cross-sectional view of memory cells according to some embodiments.

FIG. 5 is a cross-sectional view of memory cells 70 and 80 according to some embodiments. Memory cells 70 and 80 include halo implants 90, which comprise elements that are heavily doped with p-type charge carriers. Halo implants 90 may reduce short channel effects during operation of memory cells 70 and 80. In the illustrated embodiment, halo implants 90 are doped to a "p++" charge carrier concentration in comparison to body region 11 and substrate 30. Many other memory cell configurations may be used according to some embodiments.

Figure 6:
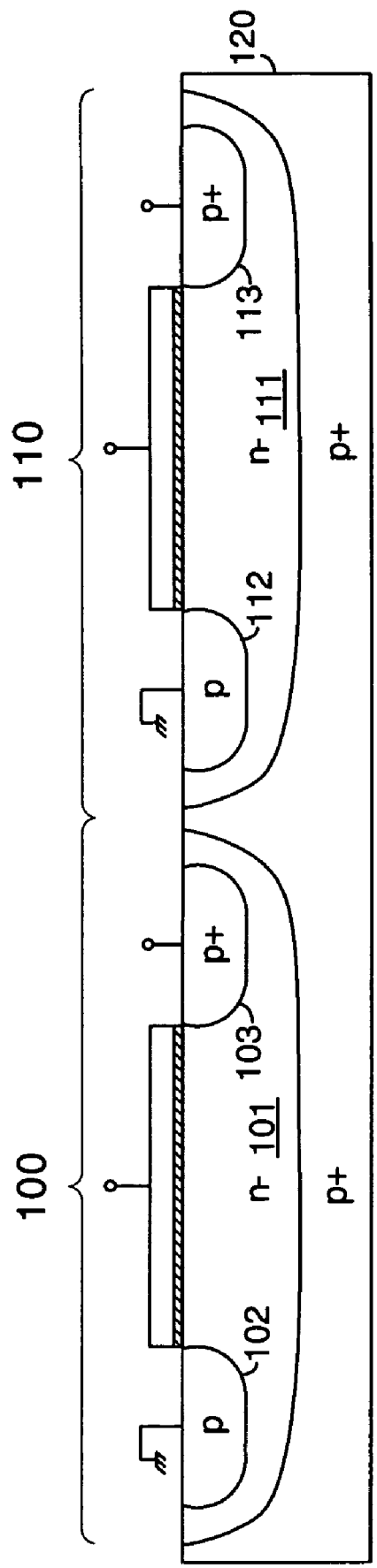
FIG. 6 is a cross-sectional view of memory cells according to some embodiments.
Figure 7:
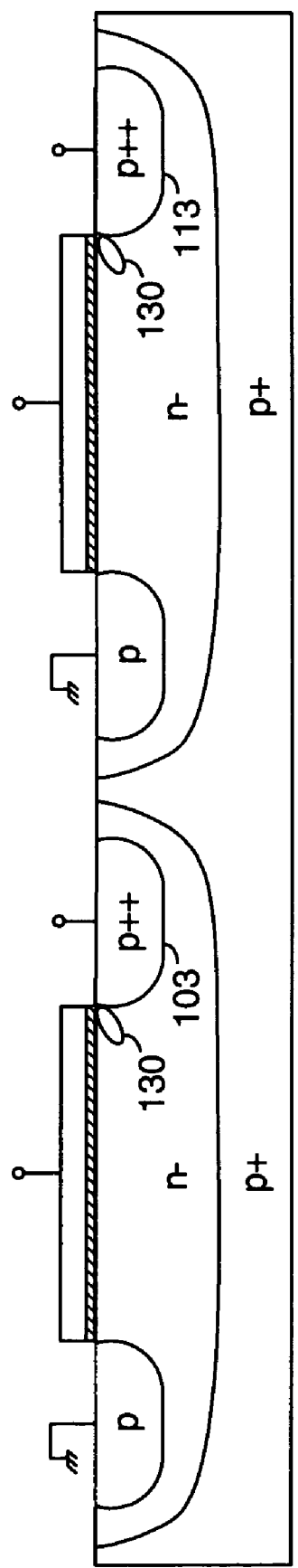
FIG. 7 is a cross-sectional view of memory cells according to some embodiments.

For example, FIG. 6 shows memory cells 100 and 110, each of which is implemented using a pnp transistor. Accordingly, substrate 120, body region 101, and body region 111 are doped with n-type charge carriers (i.e. electrons), and source regions 102, 112 and drain regions 103, 113 are doped with p-type charge carriers. Relative doping concentrations are indicated in FIG. 6, with substrate 120 ("n+") being more heavily doped than body regions 101, 111 ("n–"), and with drain regions 103, 113 ("p+") being more heavily doped than source regions 102, 112 ("p"). FIG. 7 is identical to FIG. 6 except for the addition of halo implants 130 ("n+") adjacent to source regions 103, 113.

Accordingly, some embodiments may be used in conjunction with any memory cell having a body region doped with charge carriers of a first type, a source region disposed in the body region and doped with charge carriers of a second type, and a drain region disposed in the body region and doped with charge carriers of the second type. Moreover, the body region and the source region form a first junction, the body region and the drain region form a second junction, and a conductivity of the first junction from the body region to the source region in a case that the first junction is unbiased is substantially less than a conductivity of the second junction from the body region to the drain region in a case that the second junction is unbiased.

Figure 8:
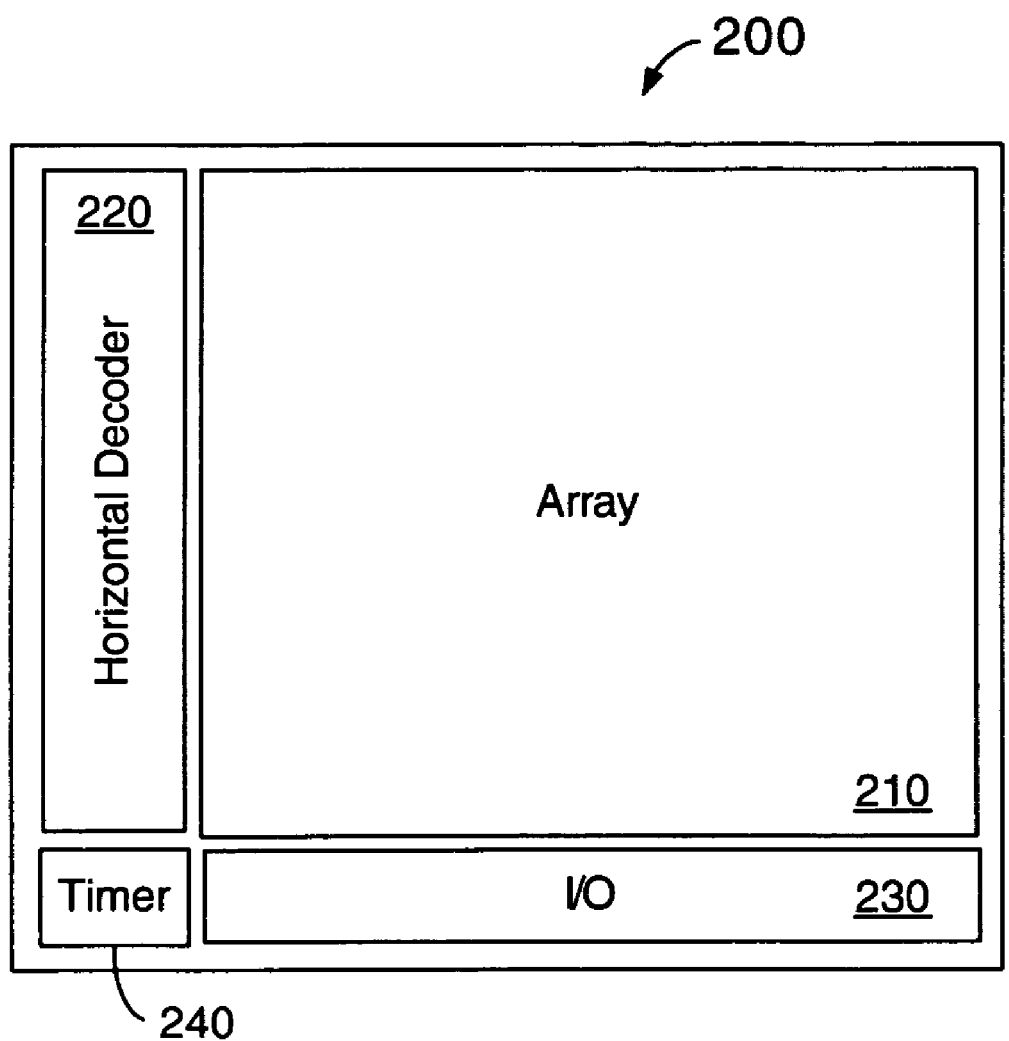
FIG. 8 is a block diagram of a memory according to some embodiments.

FIG. 8 is a block diagram of memory 200 according to some embodiments. Memory 200 includes memory cell array 210, horizontal decoder 220, I/O unit 230 and timer 240. Memory cell array 210 may include many memory cells such as those shown in FIGS. 2, 5, 6, and/or 7. For example, a 32 kB memory array may include 256 columns of 128 memory cells each.

Horizontal decoder 220 may control signals applied to the gate and drain of each memory cell of memory cell array 210. I/O unit 230 may include devices to read values stored by the memory cells. In this regard, timer 240 may provide suitable timing for the signals described herein.

Figure 9:
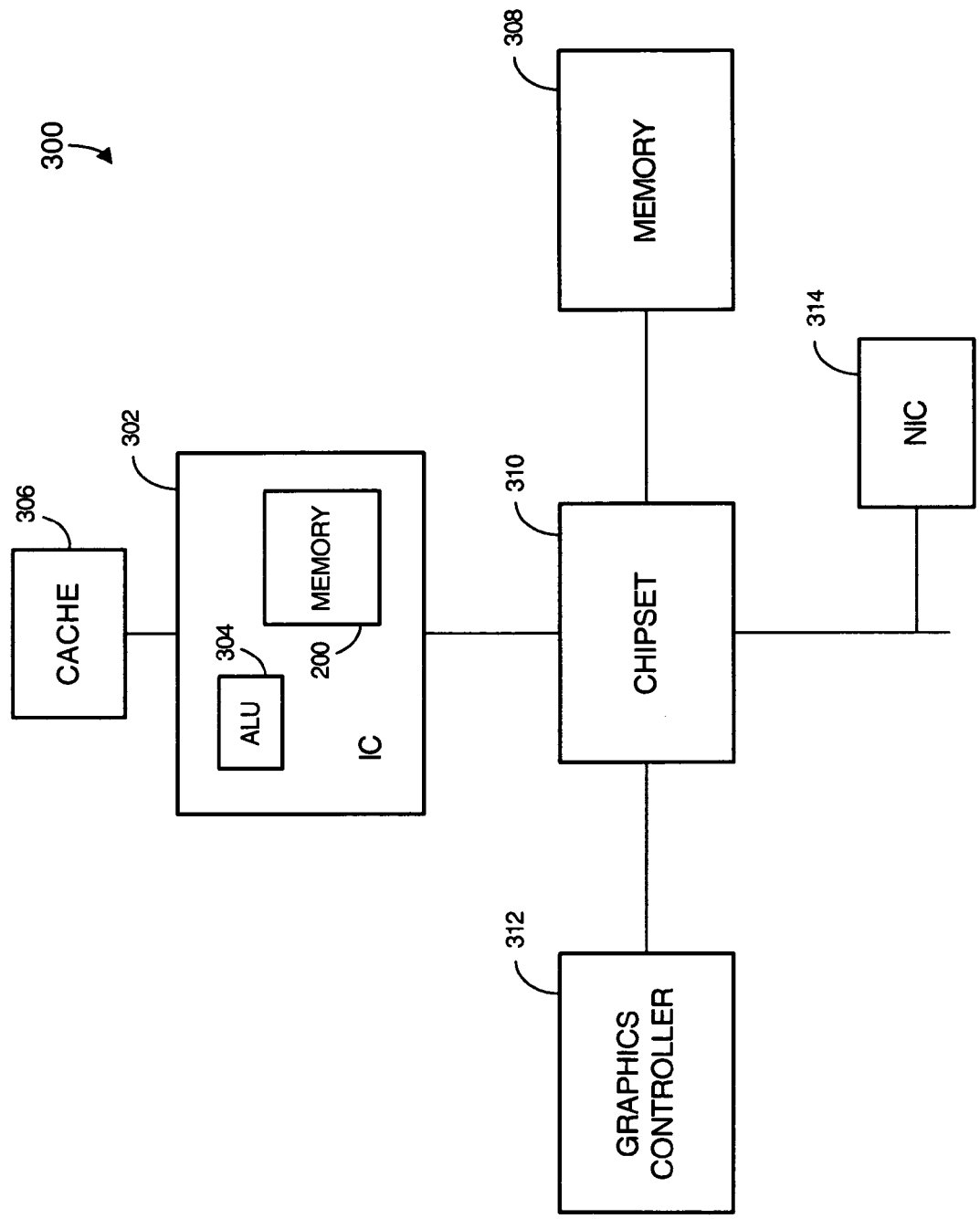
FIG. 9 is a block diagram of a system according to some embodiments.

FIG. 9 illustrates a block diagram of system 300 according to some embodiments. System 300 includes integrated circuit 302 comprising sub-blocks such as arithmetic logic unit (ALU) 304 and memory 200, which serves as an on-die cache. Integrated circuit 302 may be a microprocessor or another type of integrated circuit. Integrated circuit 302 communicates with off-die cache 306 according to some embodiments. Off-die cache 306 may also comprise a memory such as memory 200. Integrated circuit 302 may communicate with system memory 308 via a host bus and chipset 310. System memory 308 may comprise any type of memory for storing data, such as a Single Data Rate Random Access Memory, a Double Data Rate Random Access Memory, or a Programmable Read Only Memory. Other off-die functional units, such as graphics controller 312 and Network Interface Controller (NIC) 314, may communicate with integrated circuit 302 via appropriate busses or ports.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A method to write a value to a memory cell, comprising:

forward-biasing a first junction formed by a body region of the memory cell, the body region doped with charge carriers of a first type, and a drain region disposed within the body region, the drain region doped with charge carriers of a second type, to eject charge carriers of the first type from the body region, wherein the body region is disposed within a substrate doped with charge carriers of the first type, wherein a source region disposed in the body region is doped with charge carriers of the second type and is coupled to ground, wherein the body region and the source region form a second junction, and wherein a conductivity of the second junction from the body region to the source region in a case that the second junction is unbiased is substantially less than a conductivity of the first junction from the body region to the drain region in a case that the first junction is unbiased, wherein the memory cell comprises a first halo implant disposed in the body region, the first halo implant doped with charge carriers of the first type, the first halo implant and the drain region to form at least a portion of the first junction, wherein the memory cell comprises a second halo implant disposed in the body region, the second halo implant doped with charge carriers of the first type, the second halo implant and the source region to form at least a portion of the second junction;

wherein a concentration of charge carriers of the first type in the first halo region is greater than a concentration of charge carriers of the first type in the substrate, and the concentration of charge carriers of the first type in the substrate is greater than a concentration of charge carriers of the first type in the body; and wherein a concentration of charge carriers of the second type in the drain region is greater than a concentration of charge carriers of the second type in the source region.

2. A method according to claim 1, wherein the first halo implant is more heavily doped than the body region.

3. A method according to claim 1, wherein the memory cell comprises a trench adjacent to the body region to separate the body region from an adjacent memory cell.

4. A method according to claim 1, wherein a concentration of charge carriers of the first type in the second halo region is greater than the concentration of charge carriers of the first type in the substrate.

\* \* \* \* \*